United States Patent [19]

Butler et al.

[11] Patent Number: 5,577,193
[45] Date of Patent: Nov. 19, 1996

[54] MULTIPLE DATA REGISTERS AND ADDRESSING TECHNIQUE THEREFORE FOR BLOCK/FLASH WRITING MAIN MEMORY OF A DRAM/VRAM

[75] Inventors: Edward Butler, Jonesville, Vt.; Ronald A. Sasaki, San Jose, Calif.

[73] Assignee: International Business Machines Corporation, Armonk, N.Y.

[21] Appl. No.: 314,112

[22] Filed: Sep. 28, 1994

[51] Int. Cl.⁶ .................................................. G06F 12/06
[52] U.S. Cl. .......................... 395/515; 395/507; 345/201
[58] Field of Search .......................... 395/131, 162–166; 365/230.03, 230.06, 189.01, 900, 189.02, 230.02, 189.04, 238.5, 189.05; 345/185, 186, 196, 200, 201, 199, 114

[56] References Cited

U.S. PATENT DOCUMENTS

| | | | |
|---|---|---|---|
| 4,635,048 | 1/1987 | Nishi et al. | 345/203 |
| 4,684,942 | 8/1987 | Nishi et al. | 345/199 |
| 4,804,948 | 2/1989 | Nishi et al. | 345/186 |
| 4,823,120 | 4/1989 | Thompson et al. | 345/199 |
| 4,845,477 | 4/1989 | Shibata et al. | 345/22 |
| 4,857,899 | 8/1989 | Ishii | 345/150 |
| 4,893,114 | 1/1990 | Ishii | 345/22 |
| 4,908,700 | 3/1990 | Ishii et al. | 348/587 |
| 5,038,300 | 8/1991 | Seiler et al. | 395/131 |
| 5,045,967 | 9/1991 | Igarashi | 395/131 |
| 5,208,903 | 5/1993 | Curry | 395/131 |
| 5,218,671 | 6/1993 | Liao et al. | 395/131 |
| 5,229,971 | 7/1993 | Kiryn et al. | 365/230.03 |
| 5,319,606 | 6/1994 | Bowen et al. | 365/230.06 |
| 5,321,809 | 6/1994 | Aranda | 395/164 |
| 5,392,241 | 2/1995 | Bulter et al. | 365/189.01 |

*Primary Examiner*—Kee M. Tung
*Attorney, Agent, or Firm*—Heslin & Rothenberg, P.C.

[57] ABSTRACT

A frame buffer construction and data storage technique for computer graphics display systems are presented employing a plurality of on-chip color registers. The plurality of on-chip color registers facilitate block writing and flash writing of multiple color information into the main frame buffer video memory. Addressing of the plurality of color registers is achieved at a column address strobe (CAS) cycle page mode rate for both the loading of the registers and the block or flash writing of the contents of the registers into the main memory array.

31 Claims, 6 Drawing Sheets

MULTIPLE DATA REGISTERS AND ADDRESSING TECHNIQUE THEREFORE FOR BLOCK/FLASH WRITING MAIN MEMORY OF A DRAM/VRAM

TECHNICAL FIELD

This invention relates in general to computer graphics display systems, and more particularly, to an enhanced frame buffer construction and data storage technique for such systems wherein a plurality of on-chip color registers are employed to facilitate block (or flash) writing of, for example, multiple color information to frame buffer video memory. A unique addressing technique for the on-chip registers is also presented.

BACKGROUND OF THE ART

Computer graphics display systems, e.g., CAD/CAM graphics workstations, are widely used to generate and display two-dimensional images of three-dimensional objects for scientific, engineering, manufacturing and other applications. In such graphics systems, digital representations of computer generated images conventionally reside in an array of video random access memory (VRAM), which collectively embody the system frame buffer. The rate at which the frame buffer can be updated is a critical parameter in the performance of the entire graphics system. In addition, with the ever increasing use of graphics workstations there is a need to perform ever more varied color renderings, which conventionally negatively impact system performance.

Dynamic random access memories (DRAMs) are the memory of choice for many computer memory systems. In most DRAMs, single-bit storage elements or cells are arranged in an array fashion. The array is composed of words and columns, where rows are referred to as "word lines" and columns are referred to as "bit lines". Data lines transfer data to and from the storage arrays. In conventional read and write operations, one memory cell in each column is connected to its corresponding bit line. A sense amplifier attached to each bit line amplifies and restores the signals placed on the bit line during a read operation. In a DRAM chip, read and write operations each require two steps. The first step is to select the row, which is done by asserting a row address strobe (RAS) while the desired row address is on the address inputs. An on-chip row decoder then produces a vector whose bits are zero everywhere except for a one at a selected row. This bit vector determines which row of storage cells is connected to the bit lines and their associated sense amplifiers.

The second step is to select the column, which is done by asserting a column address strobe (CAS) and a read-write signal while the desired column address is on the address inputs. The column address selects a bit from the active row of memory in each array. The selected bits are either buffered for output (during read operations) or assigned values received from the data inputs (during write operations).

A VRAM is a particular type of DRAM designed specifically to allow video scanout to be independent of other frame-buffer operations in a video display system. A VRAM chip is similar to a conventional DRAM chip but contains a parallel-in/serial-out data register connected to a second data port. The serial register can be as wide as the memory array and can be parallel loaded by asserting the transfer signal while a row of memory is being read. The serial register has its own data clock, enabling it to transfer data out of the chip at high speeds. The serial register and port effectively provide a second serial port to the memory array. If this port is used for video scanout, scanout can occur asynchronously to normal reads from the writes to the chip, virtually eliminating any video scanout problem.

One approach to enhancing performance of a DRAM or VRAM is to incorporate a block write feature (and/or a flash write feature) into the memory circuit. A block write allows data to be simultaneously written to a set of bit lines along an accessed word line. In the existing art, a block write function is accomplished by accessing the word lines for a normal read, writing the data to selected bit lines by overpowering the associated sense amplifiers, and then carrying out the normal restore cycle. One preferred approach to block overwriting is described in a co-pending application entitled "Semiconductor Memory Circuit With Block Overwrite", Ser. No. 08/165,778, assigned to the same assignee as the present invention.

Traditionally, VRAM chips incorporate a single color register which serves to temporarily hold color data to be written during a block write or flash write operation. Unfortunately, with a single color register, only one color may be written at RAS cycle time into the memory array. Thus, writing of multiple colors is inconvenient and time consuming because each color must be separately loaded into the color register between write operations.

The invention described herein presents a technique for significantly enhancing performance of a video RAM when multiple color renderings are desired of the graphics system.

DISCLOSURE OF INVENTION

Briefly summarized, the present invention comprises in one aspect a memory system having a first array of addressable memory cells and a second array of addressable memory cells. The second array of addressable memory cells is independently addressable from the first array of addressable memory cells and is coupled to the first array of addressable memory cells for providing data thereto. A first address means is provided for column addressing in a single CAS cycle a plurality of addressable memory cells of the first array of addressable memory cells using Y address bits of an X address bit signal, wherein X>Y such that unused address bits in the X address bit signal exist. Second address means is also provided for employing the unused address bits of the X address bit signal in the same CAS cycle to address one addressable memory cell of the second array of addressable memory cells for transfer of data from said one addressable memory cell directly to the plurality of addressable memory cells of the first array of addressable memory cells. In the specific embodiment presented, the second array of addressable memory cells comprises an array of eight color registers, and the memory system is a VRAM chip for a graphics system.

In another aspect, a graphics system is disclosed having a display device with an array of pixels upon which an object is to be rendered. A graphics processor generates color and coordinate data for each pixel of the object to be rendered and forwards this data to a raster processor that is also coupled to the display device. The raster processor includes multiple memory systems in a frame buffer. Each memory system has a main memory array with a plurality of addressable memory locations and a plurality of multi-bit registers for storing color data. Each register is separately addressable. An addressing means is provided for selecting one register of the plurality of multi-bit registers and multiple memory locations of the main memory array for transfer of color data from the one register to the multiple memory locations in response to a single, multi-bit address signal. Transfer means are provided for accomplishing the transfer of data stored in the memory systems of the raster processor to the corresponding pixels of the display device for rendering of the object.

In still another aspect, a method is provided for block writing in a RAS time cycle different color data to different blocks of memory cells of a main memory array using a plurality of associated color registers, each color register being separately addressable and capable of storing different color data. The method includes the steps of: initiating a RAS cycle; subsequent to initiating the RAS cycle, and during a single CAS cycle, decoding a column address signal to address one color register of the plurality of associated color registers and multiple memory cells of the main memory array; still within the single CAS cycle, block writing color data from the one color register to the multiple memory cells of main memory array; and repeating the addressing and block writing steps in a second single CAS cycle for a second column address signal such that different color data is written to different blocks of memory cells of the main array within the RAS cycle.

In a further aspect, a method is provided for loading color data into multiple registers of a video memory also having a main array of addressable memory cells. This method includes: monitoring when a load color register signal transitions active; receiving color data at a data input to the video memory; receiving and decoding predefined address bits of an input column address signal to identify one register of the multiple registers for storing the received color data; and loading the color data into this one register. The method further includes accomplishing the address decoding and register loading steps in a single CAS cycle.

In a yet further aspect, a method for writing data from one register of an array of multiple registers into a plurality of memory cells of main memory is provided. The method includes: receiving and decoding a single, multi-bit address signal that identifies one register of the multiple registers and a partial address of the plurality of addressable memory locations of the main memory array; and writing data from the one data register to the plurality of addressable memory locations of the main memory array.

To restate, an enhanced frame buffer construction and data storage technique for a computer graphics display system are presented, wherein a plurality of on-chip color registers facilitate block writing of multiple color information to frame buffer video memory. Significantly increased VRAM performance is obtained because addressing of the plurality of registers is achieved at a CAS cycle time in page mode fashion for both loading of the multiple on-chip registers and writing the contents of the registers into the main DRAM array. In the specific embodiment presented, all eight color registers can be loaded in a first RAS cycle and the main array can be written with selected data from the multiple registers in a second RAS cycle. Thus, enhanced performance is obtained where multiple color renderings are desired. Further, depending upon the specific colors to be rendered, loading of the multiple on-chip color registers prior to writing of data to the main memory array may be unnecessary in every instance.

BRIEF DESCRIPTION OF DRAWINGS

These and other objects, advantages and features of the present invention will be more readily understood from the following detailed description of certain preferred embodiments of the present invention, when considered in conjunction with the accompanying drawings in which.

BEST MODE FOR CARRYING OUT THE INVENTION

Figure 1:
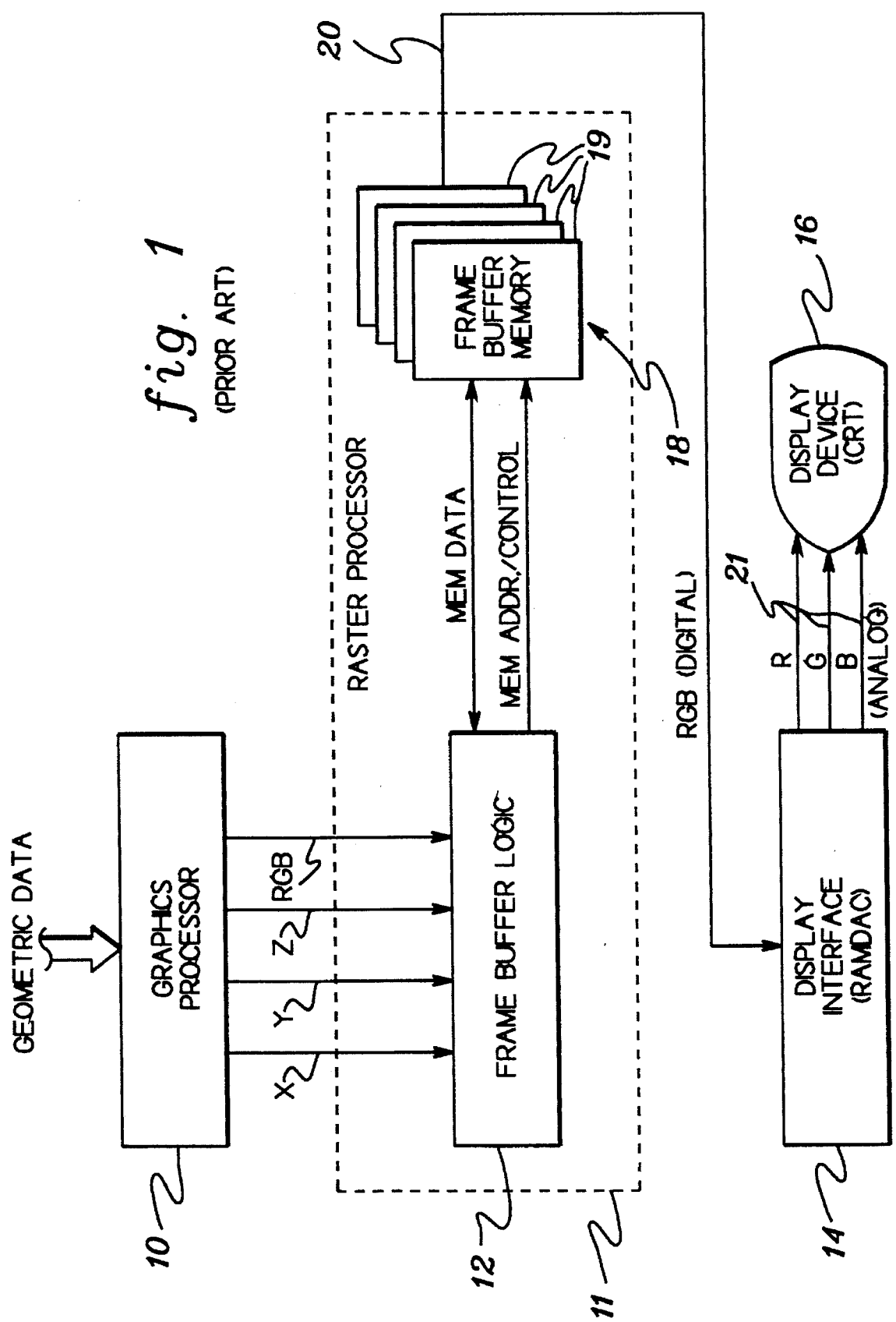
FIG. 1 is a block diagram illustration of a graphics system structure.

A graphics system is shown schematically in FIG. 1. A graphics processor 10 generates from received geometric data an X, Y and Z coordinate for each pixel of an object to be rendered. Along with the three axis coordinates, a color, usually specified by red, green and blue components (RGB), is generated for each pixel required to describe an object to be rendered. The graphics processor may start at any X, Y, Z coordinate location and generate a sequence of adjacent pixels, typically proceeding in the vertical or horizontal direction. The processor also provides an appropriate signal which informs an associated raster processor 11 that valid pixel data is available. A frame buffer logic 12 of the raster processing engine 11 communicates to graphics processor 10 when frame buffer memory 18 is ready to accept pixel data.

A display interface (or RAMDAC 14) accepts ordered pixel data from engine 11 in the form of digital color (RGB) via connection 20. This data is provided by frame buffer memory 18 from the serial port of the video RAM modules, discussed below, and is ordered to correspond to screen pixel locations. The display interface operates to generate the analog signals RGB on line 21 necessary to display the image on a display device (or cathode ray tube (CRT)) 16, along with the appropriate control signals. Although a CRT or monitor device is shown, the techniques employed herein work equally well for any two-dimensional display device such as a plotter, printer, or other monitor type.

As noted, the frame buffer memory of the graphics system typically employs multiple video random access memory (VRAMs) chips. Each VRAM conventionally incorporates a single color register feature to provide color information for a write operation to the main array, such as a flash write operation or a block write operation, both of which are well known in the art. For example, refer to the above-referenced U.S. patent application. Since existing VRAMs accommodate only a single register, then only one color may be stored at a time. Thus, performance necessarily suffers when different colors are to be written to main memory since each new color must be separately loaded into the color register at RAS time before, for example, the block write operation.

Figure 2:
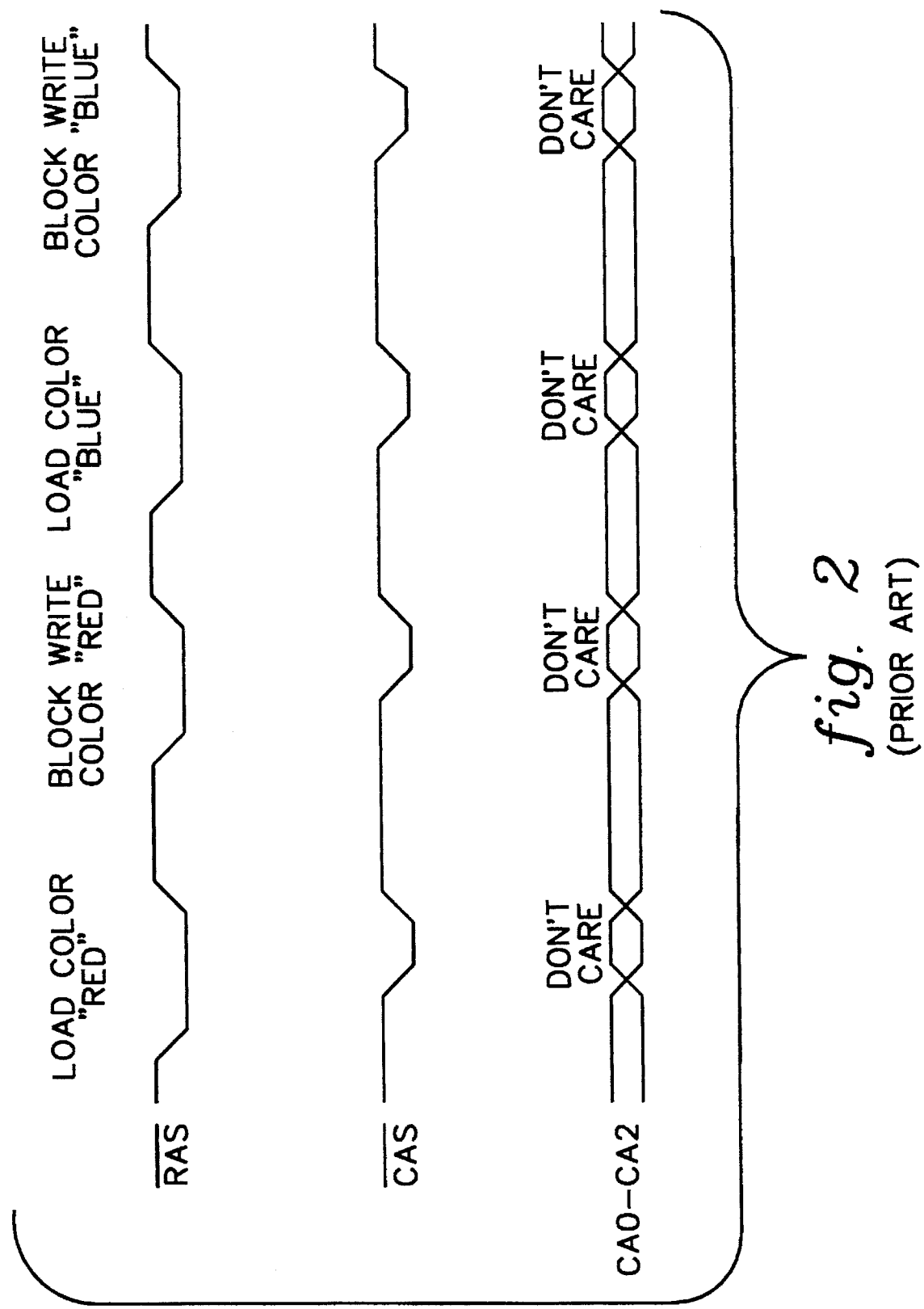
FIG. 2 is a conventional timing diagram for writing color data to a memory array from a single color register.

As shown in FIG. 2, the conventional approach is to load the color register with a single color in a first RAS cycle and then write the main array in block write fashion based on the contents of the color register in a second RAS cycle. Obviously, this is time consuming when multiple color renderings are called for. Note also with respect to FIG. 2 that pursuant to Joint Electron Device Engineering Counsel (JEDEC) standards, the low order column address bits CA0, CA1 & CA2 are unused during both loading of color data into the single register and block or flash writing of color data therefrom into the main memory. These three column addresses can be treated as "don't cares" during such operations. The present invention advantageously employs this standard in a novel addressing technique.

Specifically, the three lowermost order column address bits are employed during a register load cycle to address one of eight color registers provided in accordance with the present invention. Since three address bits are available under present JEDEC standards, eight color registers may be separately addressed using these bits. In a subsequent RAS cycle, both the main array and the color register array may be addressed and color data information block written into the main array from one or more selected color register. As noted below, pursuant to the present invention multiple blocks of color data may be written into main memory in a "page mode fashion", i.e., data may be block written into the main array at RAS cycle time by repeating the CAS cycle within that interval. Addressing of eight color registers is today the limit since all other address bits are needed for a load color register cycle under JEDEC standards. By way of example, reference the JEDEC standard for a 4 MB VRAM.

Figure 3:
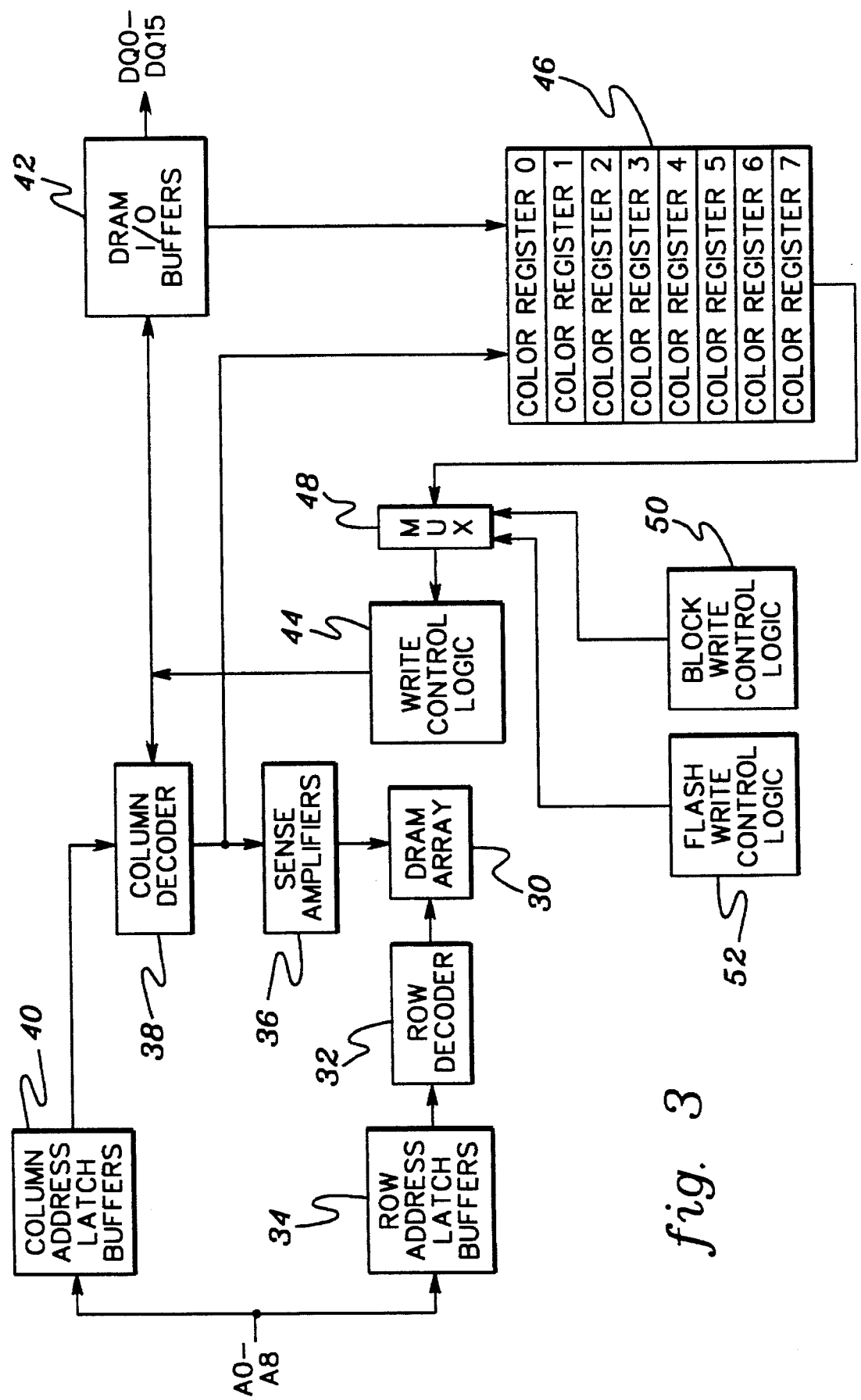
FIG. 3 is a block diagram illustration of a video random access memory structure in accordance with the present invention.

One embodiment of a video random access memory in accordance with the present invention is depicted in FIG. 3. This video memory system includes a dynamic random access memory array 30 consisting of a plurality of memory cells arranged in a conventional grid configuration accessed by word lines and bit lines (not shown). In one embodiment, each memory cell comprises a one-transistor/one-capacitor memory cell consisting of an N-channel transistor and a capacitor element. A row decoder 32 decodes a row address received at inputs A0, A1, A2 ... A8, and temporarily held in a row address latch buffer 34. Using the decoded address, row decoder 32 selects one word line of array 30. ARAS clock generator (not shown) clocks row decoder 32. In normal operation, the RAS clock generator responds to a Row Enable master signal. Similarly, a CAS clock generator responds to a received Column Enable master signal. Neither generator is shown in the drawing, however, for purposes of simplification.

The CAS clock generator provides a clock that drives a column decoder 38 which receives column address signals from inputs A0, A1 ... A8 via a column address latch buffer 40. Column decoder 38 is coupled through sense amplifiers 36 to the bit lines of memory array 30. Sense amplifiers 36 amplify read data signals to a voltage signal level employed by the semiconductor memory device. After a row address has been asserted and the row has been selected in the array, at a point in time later, a column address is asserted that identifies which node in the array, i.e. which piece of data, is selected. The selected data is then brought out through a DRAM I/O buffer 42. This buffer 42 drives off-chip loads (not shown) through the input/output connections, i.e., DQ0 ... DQ15.

Data can be written into array 30 through DRAM I/O buffers 42 and multiple color registers 46 (color register 0, color register 1, color register 2, color register 3, color register 4, color register 5, color register 6, and color register 7) via a mux 48 and a write control logic 44. Also multiplexed at mux 48 are a block write control logic 50 and a flash write control logic 52. As is well known in the art, a block write function consists of writing multiple bit lines connected to a single word line, while a flash write function comprises writing all bit lines connected to a given word line. Today, a block write typically encompasses writing eight memory cells on the selected word line.

Note that FIG. 3 is presented by way of example only. As shown, pursuant to the present invention multiple color registers are provided, each of which is separately addressable by employing certain predefined address bits of an inputted address signal. In this embodiment, the eight color registers are addressed using three address bits CA0, CA1 & CA2 (wherein CA signifies column address) input to column decoder 38.

Figure 4:
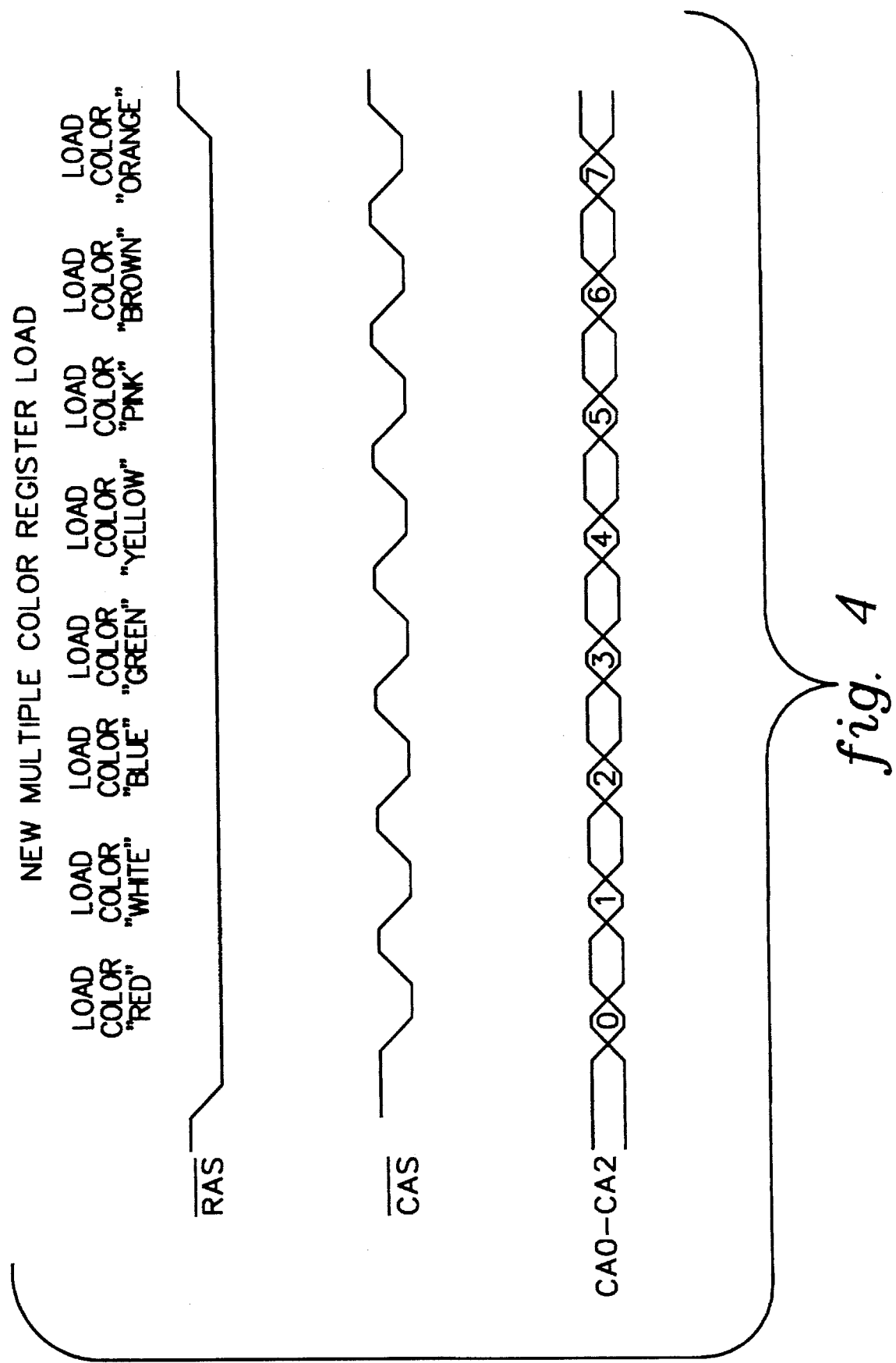
FIG. 4 is a timing diagram for loading color data into the multiple color registers of FIG. 3 in a page mode fashion.

FIG. 4 presents one embodiment for loading color data into the eight color registers of FIG. 3 in a page mode fashion. As shown, loading can be accomplished at a "page mode" rate by bringing down the RAS signal followed by writing of the respective color registers with the desired color data. Obviously, the color registers can be written in any order, with sequential loading of Reg0, Reg1, Reg2, Reg3, Reg4, Reg5, Reg6 & Reg7 being shown by way of example. Again the particular register to be loaded is identified using the designated low order column address bits CA0, CA1 & CA2. In page mode, each time the CAS signal toggles, a new address can be presented on CA0–CA2. As noted with respect to FIG. 3, data is loaded into the VRAM via the DQ pins.

Figure 5:
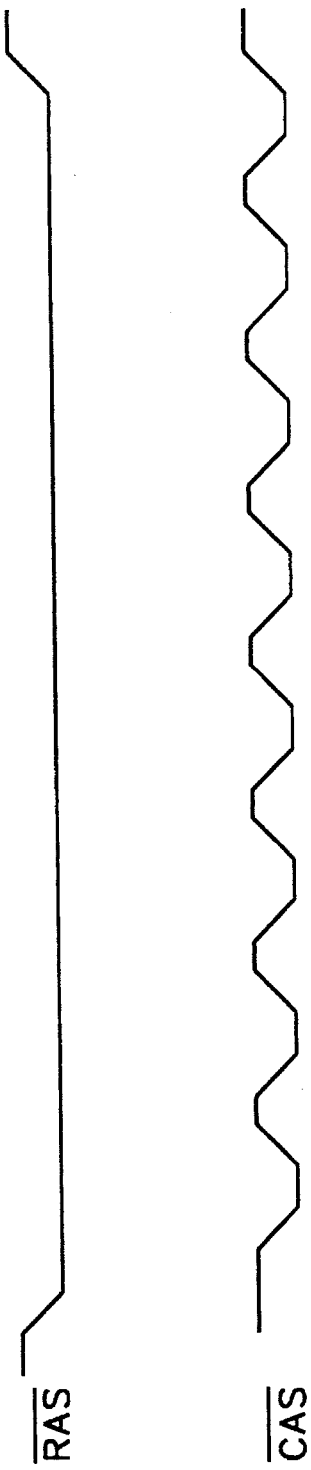
FIG. 5 is a timing diagram for writing of multiple blocks of color data in the main memory array from the multiple-color registers of FIG. 3 in a page mode fashion.

Once data has been stored into the color registers, the information can be transferred to the main array in multiple block writes made in page mode fashion. This is conceptually depicted in FIG. 5 wherein color data from each of the color registers, again by way of example, is downloaded from the register to a block of addressed memory cells of the DRAM array. The particular color data indicated is provided by way of information only and the order of data transfer from the color registers to the array can be varied. Also, data from one or any combination of color registers can be repeated and successively block written to the main array in a page mode fashion.

Figure 6:
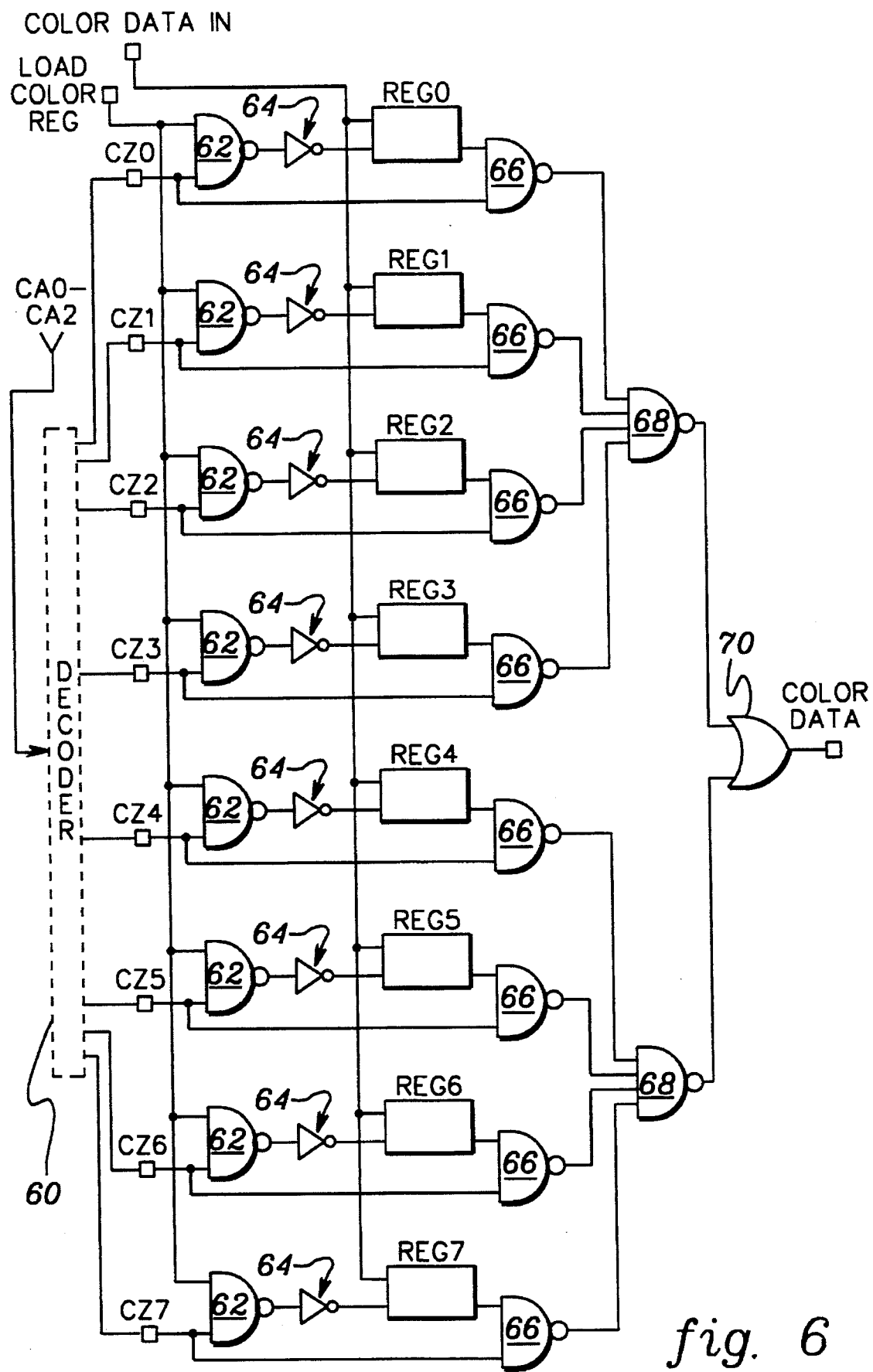
FIG. 6 is a simplified schematic of one embodiment of register address logic in accordance with the present invention for the multiple color registers of FIG. 3.

FIG. 6 presents a simplified embodiment of the multiple color registers showing a single bit of each register Reg0, Reg2, Reg2, Reg3, Reg4, Reg5 Reg6 & Reg7, along with addressing logic therefore, in accordance with the present invention. The circuitry would be repeated n times, wherein n is the bandwidth of each color register. As one example, 16 bit color registers may be employed.

The low order address signals CA0, CA1 & CA2 are initially fed to a decoder 60 which produces therefrom control signals CZ0, CZ1, CZ2, CZ3, CZ4, CZ5, CZ6 & CZ7, only one of which is active for a give CAS cycle. These decoded signals are fed to a first input of a 2-input NAND gate 62. The other input to NAND gate 62 comprises a "Load Color Reg." signal which is generated via the JEDEC load color register definition. Output from each NAND gate 62 is buffered at inverter 64 before clocking the respective register bit (Reg0, Reg1, ... , Reg7). "Color Data In" is fed to each of the registers from the DRAM I/O buffers (FIG. 3). Each register bit may comprise a latch, such a NAND latch, the output of which is fed to a first input of a two input NAND gate 66.

Each of these NAND gates is also tied to receive directly at a second input the corresponding decoded address signal CZ0, CZ1, CZ2, CZ3, CZ4, CZ5, CZ6 & CZ7 output from decoder 60. Outputs from NAND gate 66 are fed to two four-input gates 68 whose outputs are combined at an OR gate 70 which provides the "Color Data" signal to be written to the main memory array.

Loading of data to the multiple registers proceeds as follows. First the "Load Color Reg." signal goes high indicating that one or more of the color registers is to be loaded. Color data is then provided on the VRAM DQ inputs and received at the "Color Data In" pins of the color registers. An address signal is provided on lower order bits CA0, CA1 & CA2 which is decoded to generate the corresponding register address signal CZ0, CZ1, ..., CZ7. These in turn initiate loading of the color data into the appropriate register through control logic 62 & 64.

Output of data from the color registers is initiated by bringing the "load color reg." signal low. An address signal is presented and decoded such that a register is selected for reading of data therefrom. The selected color register is read, again with only one bit of each color register being depicted in FIG. 6. Once read, the data is output at the "color data" terminal for block or flash writing to the main memory array. Other control logic (not shown) directs the VRAM to look to the color data terminal for the color data to be written into the memory array.

Those skilled in the art will note from the above discussion that an enhanced frame buffer construction and data storage technique for a computer graphics display system are presented herein, wherein a plurality of on-chip color registers facilitate block writing of multiple color information to frame buffer video memory. Significantly increased VRAM performance is obtained because addressing of the plurality of registers is achieved at a CAS cycle time in page mode fashion for both the loading of the multiple on-chip registers and the writing of contents of the registers into the main DRAM array. In the specific embodiment presented, all eight color registers can be loaded in a single RAS cycle and the main array can be written with selected data from the multiple registers in a single RAS cycle. Thus, enhanced performance is obtained where multiple color renderings are desired. Further, depending upon the specific colors to be rendered, loading of the multiple on-chip color registers prior to writing of data to the main memory array may be unnecessary in every instance.

Although specific embodiments of the present invention have been illustrated in the accompanying drawings and described in the foregoing detailed description, it will be understood that the invention is not limited to the particular embodiments described herein, but is capable of numerous re-arrangements, modifications and substitutions without departing from the scope of the invention. For example, although presented herein with respect to writing of "color" data into the memory array, the multiple registers and addressing technique could also be employed for block or flash writing of other types of data into a main memory array. In addition, writing to the main memory array could encompass writing data from one register to a single memory location in the array. The following claims are intended to encompass all such modifications.

We claim:

1. A memory system comprising:

a first memory means having a first array of addressable memory cells for storing data;

a second memory means having a second array of addressable memory cells for storing data, said second array of addressable memory cells being independently addressable from said first array of addressable memory cells, and wherein said second array of addressable memory cells is coupled to said first array of addressable memory cells for transfer of data from said second array of addressable memory cells directly to said first array of addressable memory cells;

first address means for column addressing in a single column address strobe (CAS) cycle a plurality of addressable memory cells of said first array of addressable memory cells using Y address bits of an X address bit signal, wherein X>Y such that unused address bits in said X address bit signal exist; and second address means for employing said unused address bits of said X address bit signal in said single CAS cycle to address one addressable memory cell of said second array of addressable memory cells for transfer of data from said one addressable memory cell of said second array of addressable memory cells directly to said plurality of addressable memory cells of said first array of addressable memory cells.

2. The memory system of claim 1, wherein said second array of addressable memory cells of said second memory means comprises an array of multi-bit registers such that said one addressable memory cell of said second array of addressable memory cells comprises one multi-bit register.

3. The memory system of claim 2, wherein said array of multi-bit registers comprises an array of multi-bit color registers such that said one multi-bit register stores color data for transfer to said plurality of addressable memory cells of said first array of addressable memory cells.

4. The memory system of claim 3, wherein said memory system comprises a video random access memory chip.

5. The memory system of claim 1, further comprising writing means for block writing data from the one addressable memory cell of the second array of addressable memory cells directly to said plurality of addressable memory cells of the first array of addressable memory cells.

6. The memory system of claim 5, wherein said second array of addressable memory cells stores color data such that said writing means block writes color data from said one addressable memory cell of the second array of addressable memory cells to said plurality of addressable memory cells of the first array of addressable memory cells.

7. The memory system of claim 6, wherein said second array of addressable memory cells comprises an array of eight color registers and wherein said second address means includes means for employing said unused address bits of said X address bit signal in said single CAS cycle to address one color register of said array of eight color registers.

8. The memory system of claim 7, wherein said writing means includes means for block writing color data from said array of eight color registers to said first array of addressable memory cells in a page mode fashion.

9. The memory system of claim 5, wherein said writing means includes means for block writing data from multiple address memory cells of the second array of addressable memory cells directly to the first array of addressable memory cells in a page mode fashion.

10. The memory system of claim 1, wherein said first array of addressable memory cells comprises a dynamic random access memory array.

11. The memory system of claim 1, further comprising means for loading data into the second array of addressable memory cells in a page mode fashion.

12. A memory system comprising:

a memory array having a plurality of addressable memory locations;

a plurality of multi-bit registers for storing data, each multi-bit register of said plurality of multi-bit registers being separately addressable; and addressing means for selecting one multi-bit register of said plurality of multi-bit registers and an addressable memory location of said plurality of addressable memory locations in said memory array for transfer of data from said one multi-bit register to said addressable memory location in response to a single, multi-bit address signal.

13. The memory system of claim 12, further comprising means for transferring data from said one multi-bit register to said addressable memory location in a single CAS cycle in response to the single, multi-bit address signal.

14. The memory system of claim 12, wherein said plurality of multi-bit registers comprises a plurality of multi-bit color registers for storing color data.

15. The memory system of claim 12, wherein said memory system comprises a video random access memory chip.

16. The memory system of claim 15, wherein said memory array comprises a dynamic random access memory array.

17. The memory system of claim 12, further comprising means for loading data into said plurality of multi-bit registers in a page mode fashion.

18. The memory system of claim 12, further comprising means for block writing data from said one multi-bit register of said plurality of multi-bit registers to multiple addressable memory locations of said plurality of addressable memory locations in response to the single, multi-bit address signal.

19. The memory system of claim 12, further comprising means for flash writing data from said one multi-bit register of said plurality of multi-bit column registers to multiple addressable memory locations of said plurality of addressable memory locations in response to said single, multi-bit address signal.

20. A graphics system comprising:
a display device having an array of pixels upon which an object is to be rendered;
a graphics processor for generating color and coordinate data for each pixel of the object to be rendered;
a raster processor coupled to the graphics processor and to the display device, said raster processor having multiple memory systems, each memory system including
a main memory array having a plurality of addressable memory locations,
a plurality of multi-bit registers for storing color data, each multi-bit register of said plurality of multi-bit registers being separately addressable, and
addressing means for selecting one multi-bit register of said plurality of multi-bit registers and multiple addressable memory locations of said plurality of addressable memory locations in said main memory array for transfer of color data from said one multi-bit register to said multiple addressable memory locations in response to a single, multi-bit address signal; and
means for transferring data stored in said memory systems of said raster processor to the array of pixels of said display device for rendering of said object.

21. The graphics system of claim 20, wherein each memory system of said multiple memory systems comprises a dynamic random access memory (DRAM) or a video random access memory (VRAM).

22. The graphics system of claim 20, wherein each memory system includes means for block writing data from said plurality of multi-bit registers to said memory array in a page mode fashion.

23. The graphics system of claim 20, wherein each memory system of said multiple memory systems includes means for loading data into said plurality of multi-bit registers in a page mode fashion.

24. The graphics system of claim 20, wherein said plurality of multi-bit registers comprises eight multi-bit registers, each multi-bit register of said eight multi-bit registers being capable of storing a different color data.

25. A method for block writing in a single row address strobe (RAS) cycle different color data to different blocks of memory cells of a main memory array using a plurality of associated color registers, each color register being separately addressable and at least some of said color registers storing different color data, said method comprising the steps of:
(a) initiating a RAS cycle;
(b) decoding a first column address signal to select one color register of said plurality of associated color registers and to select multiple memory cells of said main memory array;
(c) block writing color data from said one color register to said multiple memory cells of said main memory array in said step (c);
(d) accomplishing said steps (b) & (c) within a first single CAS cycle; and
(e) repeating said steps (b) & (c) in a second single CAS cycle for a second column address signal such that different color data is written to different multiple memory cells of the main memory array within said RAS cycle.

26. The method of claim 25, further comprising the steps of:
successively repeating said steps (b) & (c) in additional single CAS cycles for additional column address signals such that multiple different color data is written to different multiple memory cells of the main memory array within said RAS cycle; and
terminating said RAS cycle.

27. A method for loading color data into multiple registers of a video memory system having a main memory array of addressable memory cells and multiple separately addressable registers coupled thereto, said method comprising the steps of:
(a) monitoring when a load color register signal transitions active;
(b) receiving color data at a data input to the video memory system;
(c) during a CAS cycle, receiving and decoding predefined address bits of an input column address signal to identify one register of said multiple registers for storing the color data of said step (b); and
(d) during said CAS cycle, loading said color data into the one register identified in said step (c).

28. The method of claim 27, further comprising repeating said steps (b)–(d) in sequential CAS cycles such that color data is loaded into said multiple registers in a page mode fashion.

29. The method of claim 27, wherein said multiple registers comprise eight multi-bit color registers and wherein said receiving step (c) includes decoding three predefined address bits of the input column address signal to identify one register of said eight multi-bit color registers for storing of the color data.

30. In a memory system having a main memory array of addressable memory cells and multiple data registers independently addressable from the main memory array and coupled to the main memory array for transfer of data thereto, a method for block writing data from one register of said multiple data registers to a plurality of addressable memory cells of said main memory array, said method comprising the steps of:

(a) receiving and decoding a single, multi-bit address signal, said single, multi-bit address signal identifying one data register of said multiple data registers and a partial address of a plurality of addressable memory locations of said main memory array; and (b) block writing data from the one data register of said multiple data registers to said plurality of addressable memory locations of said main memory array.

31. The method of claim 30, further comprising repeating said steps (a) & (b) for multiple multi-bit address signals such that data from said multiple data registers is block written to the main memory array in a page mode fashion.

* * * * *